United States Patent
Guo et al.

(10) Patent No.: US 9,783,702 B1
(45) Date of Patent: Oct. 10, 2017

(54) AQUEOUS COMPOSITIONS OF LOW ABRASIVE SILICA PARTICLES

(71) Applicant: Rohm and Haas Electronic Materials CMP Holdings, Inc., Newark, DE (US)

(72) Inventors: Yi Guo, Newark, DE (US); David Mosley, Lafayette Hill, PA (US); Matthew Van Hanehem, Middletown, DE (US)

(73) Assignee: Rohm and Haas Electronic Materials CMP Holdings Inc., Midland, MI (US)

( * ) Notice: Subject to any disclaimer, the term of this patent is extended or adjusted under 35 U.S.C. 154(b) by 0 days.

(21) Appl. No.: 15/297,716

(22) Filed: Oct. 19, 2016

(51) Int. Cl.
| | |
|---|---|
| G09G 1/02 | (2006.01) |
| C09G 1/02 | (2006.01) |
| C09K 3/14 | (2006.01) |
| C09G 1/04 | (2006.01) |
| C09G 1/06 | (2006.01) |
| C09G 1/00 | (2006.01) |
| C09K 13/06 | (2006.01) |
| C01B 33/14 | (2006.01) |
| H01L 21/306 | (2006.01) |
| C01B 33/18 | (2006.01) |
| B24B 37/04 | (2012.01) |
| H01L 21/321 | (2006.01) |

(52) U.S. Cl.
CPC .............. C09G 1/02 (2013.01); B24B 37/044 (2013.01); C01B 33/14 (2013.01); C01B 33/18 (2013.01); C09G 1/00 (2013.01); C09G 1/04 (2013.01); C09G 1/06 (2013.01); C09K 3/1409 (2013.01); C09K 3/1454 (2013.01); C09K 3/1463 (2013.01); C09K 13/06 (2013.01); H01L 21/30625 (2013.01); H01L 21/3212 (2013.01)

(58) Field of Classification Search
None
See application file for complete search history.

(56) References Cited

U.S. PATENT DOCUMENTS

| | | | |
|---|---|---|---|
| 6,334,880 B1 * | 1/2002 | Negrych | C09K 3/1409 106/3 |
| 8,114,178 B2 | 2/2012 | Izumi et al. | |
| 9,499,721 B2 | 11/2016 | Spies et al. | |
| 2011/0163262 A1 | 7/2011 | Higuchi et al. | |
| 2015/0102012 A1 | 4/2015 | Reiss et al. | |
| 2015/0259574 A1 * | 9/2015 | Grumbine | H01L 21/3212 438/693 |
| 2015/0267083 A1 | 9/2015 | Ward et al. | |
| 2015/0376458 A1 | 12/2015 | Grumbine et al. | |

OTHER PUBLICATIONS

Jindal, et al, Chemical Mechanical Polishing of Dielectric Films Using Mixed Abrasive Slurries, Journal of the Electrochemical Society, 150 (5) G314-G318 (2003).

* cited by examiner

*Primary Examiner* — Jiong-Ping Lu
(74) *Attorney, Agent, or Firm* — Andrew E. C. Merriam

(57) ABSTRACT

The present invention provides aqueous chemical mechanical planarization (CMP) polishing compositions having a pH ranging from 2.5 to 5.3 and comprising a mixture of spherical colloidal silica particles and from 30 to 99 wt. %, based on the total weight of silica solids in the aqueous CMP polishing composition, of elongated, bent or nodular silica particles wherein the colloidal and elongated, bent or nodular silica particles differ from each other in weight average particle size (CPS) less than 20 nm, wherein at least one of the spherical colloidal silica particles and the elongated, bent or nodular silica particles contains one or more cationic nitrogen atoms. The present invention further provides methods of using the compositions in high downforce CMP polishing applications.

11 Claims, No Drawings

AQUEOUS COMPOSITIONS OF LOW ABRASIVE SILICA PARTICLES

The present invention relates to aqueous chemical mechanical planarization (CMP) polishing compositions comprising a mixture of spherical colloidal silica particles and elongated, bent or nodular silica particles wherein at least one of the spherical colloidal silica particles and the elongated, bent or nodular silica particles contains a cationic nitrogen atom.

Presently, users of aqueous chemical, mechanical planarization polishing (CMP) compositions used with CMP polishing pads to polish substrates wish to reduce their costs by reducing the solids contents of aqueous abrasive slurries used in such polishing to levels of from 1 to 10 wt. % of solids. However, such aqueous silica slurry CMP compositions fail to perform well, particularly under high down force conditions as needed for hard dielectric wafer substrates such as memory chips or modules. In high down force CMP polishing, the space between a wafer substrate and polishing pad surfaces is significantly constricted, thereby causing the failure of abrasive particle transport during polishing from the pad edge to the pad center. The result has been a substantial lack of planarity in substrates polished using high down force CMP polishing, adversely impacting planarization efficiency. In addition, the friction between pad and substrate during polishing increases significantly, increasing polishing temperature and leading to pad abrasion or wear instead of polishing the substrate and resulting in shortened polishing pad life. Further, with increasing down force, the substrate removal rate found when using known aqueous silica slurries can stagnate and even decrease.

U.S. patent publication no. US2011/0163262 A1, to Higuchi et al. discloses compositions containing a mixture of colloidal silica and, as secondary particles, branched or bent silica particles, we well as methods of producing such silica compositions. Higuchi focuses on the purity of the resulting aqueous slurry compositions. However, none of the Higuchi compositions address, much less solve, the problem of excessive friction build up during polishing or the lack of planarity in substrates resulting from high downforce CMP polishing.

The present inventors have endeavored to solve the problem of providing aqueous silica CMP polishing compositions that provide more consistent substrate polishing performance at low silica solids contents in high down force applications.

STATEMENT OF THE INVENTION

1. In accordance with the present invention, aqueous chemical mechanical planarization (CMP) polishing compositions comprise a mixture of spherical colloidal silica particles and elongated, bent or nodular silica particles that differ from each other in weight average particle size (CPS) less than 20 nm, the composition having a pH ranging from 2.5 to 5.3 or, preferably, from 3 to 5, wherein at least one of the spherical colloidal silica particles and the elongated, bent or nodular silica particles contains one or more cationic nitrogen atoms, and, further wherein, the amount of the elongated, bent or nodular silica particles ranges from 30 to 99 wt. %, or from 30 to 95 wt. %, or, preferably 40 to 90 wt. %, or, more preferably, from 40 to 85 wt. %, based on the total weight of silica solids in the aqueous CMP polishing composition.

2. In accordance with the aqueous CMP polishing compositions as in item 1, above, wherein the one or more cationic nitrogen atoms comes from an aminosilane that contains one or more cationic nitrogen atom at the pH of the aqueous CMP polishing composition, whereby at least one of the spherical colloidal silica particles or the elongated, bent or nodular silica particles are aminosilane group containing silica particles, preferably, wherein the elongated, bent or nodular silica particles further contain a protonated amine or quaternary ammonium.

3. In accordance with the aqueous CMP polishing compositions as in any one of items 1 or 2, above, wherein the aminosilane is chosen from an aminosilane containing one or more tertiary amine group, such as N,N-(diethylaminomethyl)triethoxysilane (DEAMS), or one or more secondary amine group, such as N-(2-aminoethyl)-3-aminopropyltrimethoxysilane (AEAPS) or N-aminoethylaminoethylaminopropyl trimethoxysilane (DETAPS), preferably, an aminosilane containing one or more tertiary amine group.

4. In accordance with the aqueous CMP polishing compositions as in any one of items 2 or 3, above, wherein the amount of aminosilane ranges from 0.0020 to 0.25 wt. %, or, preferably, from 0.003 to 0.1 wt. % or, more preferably, from 0.003 to 0.02 wt. %, based on the total silica solids in the aqueous CMP polishing compositions.

5. In accordance with the aqueous CMP polishing compositions as in any one of items 1, 2, 3, or 4, above, further comprising a compound containing two quaternary ammonium groups, such as hexabutyl $C_1$-$C_8$ alkanediammonium dihydroxides or salts, such as dihalides, thereof, for example, N,N,N',N',N'-hexabutyl-1-6-hexanediammonium dihydroxide, or, preferably, N, N, N, N', N', N'-hexabutyl-1,4-butanediammonium dihydroxide (HBBAH).

6. In accordance with the aqueous chemical mechanical planarization (CMP) polishing compositions as in item 5, above, wherein the amount of the compound containing two quaternary ammonium groups ranges from 1 to 2000 ppm or, preferably, from 5 to 500 ppm or, more preferably, 10 ppm to 200 ppm, based on the total silica solids in the aqueous CMP polishing composition.

7. in accordance with the aqueous chemical mechanical planarization (CMP) polishing compositions as in any one of items 1, 2, 3, 4, 5, or 6, above, wherein the one or more cationic nitrogen atoms comes from a protonated amine or quaternary ammonium that is contained within the elongated, bent or nodular silica particles or, preferably, wherein the one or more cationic nitrogen atoms comes from the protonated amine or quaternary ammonium that is contained within the elongated, bent or nodular silica particles and as well from any of an aminosilane, a compound containing two quaternary ammonium groups, or both an aminosilane and a compound containing two quaternary ammonium groups.

8. In accordance with the aqueous chemical mechanical planarization (CMP) polishing compositions as in any one of items 1, 2, 3, 4, 5, 6, or 7, above, wherein the weight average particle sizes (CPS) of the silica particles ranges from 10 nm to 200 nm, or, preferably, from 25 nm to 80 nm.

9. In accordance with the aqueous chemical mechanical planarization (CMP) polishing compositions as in any one of items 1 to 8, above, further comprising a buffer, which is a carboxylate of a (di)carboxylic acid pKa of 3 to 7, or, preferably, a pKa of from 3 to 6 in the amount of from 0 to 50 millimoles per kg (mm/kg), or, preferably, 0.1 to 10 mm/kg of the total (wet) composition.

10. In accordance with the aqueous chemical mechanical planarization (CMP) polishing compositions as in any one of items 1 to 9, above, for use in polishing dielectrics or oxide containing substrates, wherein the compositions comprise no oxidizer compound, such as hydrogen peroxide.

11. In accordance with the aqueous chemical mechanical planarization (CMP) polishing compositions as in any one of items 1 to 10, above, wherein the total amount of silica particles ranges from 1 to 30 wt. %, or, preferably, from 15 to 30 wt. %, based on the total weight of the composition.

12. In accordance with a separate aspect of the present invention, methods of making an aqueous CMP polishing composition comprise mixing (i) an aqueous slurry of spherical colloidal silica particles and (ii) from 30 to 99 wt. %, or from 30 to 95 wt. %, or, preferably from 40 to 90 wt. %, or, more preferably, from 40 to 85 wt. %, based on the total weight of silica solids in the aqueous CMP polishing composition, of an aqueous slurry of elongated, bent or nodular silica particles such that the compositions (i) and (ii) differ from each other in weight average particle size (CPS) less than 20 nm, and adjusting the pH of the resulting mixture to from 2.5 to 5.3 or, preferably, from 3 to 5, with a buffer or carboxylic acid, preferably succinic acid, to form the aqueous CMP polishing compositions, wherein at least one of the spherical colloidal silica particles and the elongated, bent or nodular silica particles, or both, contains one or more cationic nitrogen atoms or, preferably, the elongated, bent or nodular silica particles comprise a protonated amine or quaternary ammonium w which provides one or more additional cationic nitrogen atoms.

13. In accordance with the methods of the present invention for making aqueous CMP polishing compositions as in item 12, above, wherein at least one of the aqueous slurries (i) or (ii), or both, is formed by treating the particles with an aqueous aminosilane at pH 6 to 9, preferably, from 7 to 8 and allowing the mixture under vigorous agitation for from 5 to 180 minutes, for example, up to 60 minutes, to form an aminosilane group containing silica particle composition containing one or more cationic nitrogen atoms, and adjusting the pH of the resulting composition to from 2.5 to 5.2 or, preferably, from 3 to 5.

14. In accordance with the methods of the present invention for making aqueous CMP polishing compositions as in item 13, the methods further comprising mixing a compound containing two quaternary ammonium groups to make the aqueous CMP polishing composition.

15. In accordance with the methods of the present invention for making aqueous CMP polishing compositions as in item 12, wherein at least one of the aqueous slurries (i) or (ii), or both, is formed by combining the aqueous slurry with a compound containing two quaternary ammonium groups to form a silica particle that contains one or more cationic nitrogen atoms.

16. In accordance with the methods of making an aqueous CMP polishing composition as in any one of items 13, 14 or 15, above, wherein the aqueous aminosilane comprises an aminosilane containing one or more tertiary amine group, such as N,N-(diethylaminomethyl)triethoxysilane (DEAMS), or one or more secondary amine group, such as N-(2-aminoethyl)-3-aminopropyltrimethoxysilane (AE-APS) or N-aminoethylaminoethylaminopropyl trimethoxysilane (DEAPS aka DETAPS).

16. In accordance with the methods of making an aqueous CMP polishing composition as in any one of items 14 or 15, wherein the compound containing two quaternary ammonium groups, is chosen from hexabutyl $C_1$-$C_8$ alkanediammonium dihydroxides or salts thereof, such as dihalides, preferably, N,N,N,N',N',N'-hexabutyl-1,4-butanediammonium dihydroxide (HBBAH).

17. In accordance with the methods of the present invention for making aqueous CMP polishing compositions as in any one of items 11 to 16, above, wherein each of aqueous slurry (i) and aqueous slurry (ii) have a solids content of from 15 to 30 wt. %.

18. In accordance with the methods of the present invention for making aqueous CMP polishing compositions as in item 17, above, the methods further comprising diluting the aqueous CMP polishing composition to a total silica particle content of from 1 to 10 wt. %, based on the total weight of the composition.

19. In accordance with yet another aspect of the present invention, methods of polishing a CMP substrate, such as a semiconductory, memory or optical dielectric substrate with a CMP polishing pad and an aqueous CMP polishing composition comprise polishing the substrate with the pad and an aqueous CMP polishing composition as in any one of items 1 to 10, above.

20. In accordance with the methods of polishing a CMP substrate as in item 19, above, wherein the polishing downforce ranges from 20.7 kPa (3 psi) to 41.5 kPa (6 psi) or, preferably, from 24.15 kPa (3.5 psi) to 36 kPa (5.2 psi).

Unless otherwise indicated, conditions of temperature and pressure are ambient temperature and standard pressure. All ranges recited are inclusive and combinable.

Unless otherwise indicated, any term containing parentheses refers, alternatively, to the whole term as if no parentheses were present and the term without them, and combinations of each alternative. Thus, the term "(poly) isocyanate" refers to isocyanate, polyisocyanate, or mixtures thereof.

All ranges are inclusive and combinable. For example, the term "a range of 50 to 3000 cPs, or 100 or more cPs" would include each of 50 to 100 cPs, 50 to 3000 cPs and 100 to 3000 cPs.

As used herein, the term "ASTM" refers to publications of ASTM International, West Conshohocken, Pa.

As used herein, the term "colloidally stable" means that a given composition does not gel or precipitate, and remains clear upon visible inspection after a given time and at a given temperature.

As used herein, the term "hard base" refers to metal hydroxides, including alkali(ne earth) metal hydroxides, such as NaOH, KOH, or $Ca(OH)_2$.

As used herein, the term "ISO" refers to publications of the International Organization for Standardization, Geneva, CH.

As used herein, the term "Particle size (CPS)" means the weight average particle size of a composition as determined by a CPS Instruments (The Netherlands) disc centrifuge system. The particles are separated by size using centrifugal forces in a solvent and quantified using optical light scattering.

As used herein, the term "silica particle solids" or "silica solids" means, for a given composition, the total amount of spherical silica particles, plus the total amount of elongated, bent or nodular silica particles, including anything with which any of those particles are treated.

As used herein, the term "solids" means any material other than water or ammonia that does not volatilize in use conditions, no matter what its physical state. Thus, liquid silanes or additives that do not volatilize in use conditions are considered "solids".

As used herein, the term "strong acid" refers to protic acids having a pKa of 2 or less, such as inorganic acids like sulfuric or nitric acid.

As used herein, the term "use conditions" means the temperature and pressure at which a given composition is used, including increases in temperature and pressure during or as a result of use.

As used herein, the term "weight fraction silica" means the total wt. % of silica, based on the total weight of the composition/100%. Thus, 30 wt. % silica equates to a weight fraction of 0.3.

As used herein, the term "wt. %" stands for weight percent.

As used herein, the term "zeta potential" refers to the charge of a given composition as measured by a Malvern Zetasizer instrument. All zeta potential measurements were made on (diluted) slurry compositions as described in the examples. The reported value was taken from an averaged measurement of zeta values using >20 acquisitions taken by the instrument for each indicated composition.

The present inventors have surprisingly found that aqueous CMP polishing compositions comprising a mixture of spherical colloidal silica and elongated, bent or nodular silica particles that differ from each other in weight average particle size (CPS) less than 20 nm (colloidal size), and wherein at least one of the elongated, bent or nodular silica particles or spherical colloidal silica particles contains a cationic nitrogen atom can lower friction during polishing and lower polishing temperatures during polishing. Further, the mixture of spherical colloidal silica particles and elongated, bent or nodular silica particles enables improvement in consistent removal rate (RR) and uniformity of removal profiles as polishing downforce increases. Further, the compositions of the present invention also enable a significantly reduced polishing temperature which favors less pad texture wearing. When evaluating the performance of the aqueous CMP polishing compositions of the present invention, a graph of RR (y) vs. pressure (x) yields a straight line as polishing downforce is increased. Still further, the blend of spherical and bent or elongated silica particles enables improved consistency or uniformity in RR as one moves across the substrate, from center to edge. The aqueous CMP polishing compositions of the present invention thus enable good polishing performance at economical low abrasive solids contents of from 1 to 5 wt. % solids.

As used herein, the term elongated, bent or nodular silica particles refers to silica particles having an aspect ratio of longest dimension to the diameter which is perpendicular to the longest dimension of from 1.8:1 to 3:1.

Suitable elongated, bent or nodular silica particles are made from suspension polymerization by hydrolytic condensation of silanols formed in a known manner from precursors like tetraethoxysilane (TEOS) or tetramethoxysilane (TMOS). Processes for making the elongated, bent or nodular silica particles are known and can be found, for example, U.S. Pat. No. 8,529,787 to Higuchi et al. The hydrolytic condensation comprises reacting the precursors in aqueous suspension in the presence of a basic catalyst, such as an alkylammonium hydroxides, alkylamines or KOH, preferably, tetramethylammonium hydroxide; the hydrolytic condensation process may incorporate one or more cationic nitrogen atoms into the elongated, bent or nodular silica particles. Preferably, the elongated, bent or nodular silica particles are cationic at a pH of 4.

Suitable bent or nodular silica particles are available from Fuso Chemical Co., Ltd., Osaka, JP (Fuso) under the tradenames HL-2, HL-3, HL-4, PL-2, PL-3 or BS-2 and BS-3 slurries. The HL and BS series particles from Fuso contain one or more nitrogen atoms which impart a cationic charge at pH 4.

To insure colloidal stability of the aqueous CMP polishing compositions of the present invention, the compositions have a pH ranging from 2.5 to 5.3 or, preferably, from 3 to 5. The compositions tend to lose their stability above the desired pH range.

Preferably, in accordance with the present invention, the aqueous CMP polishing compositions comprising a compound containing two quaternary ammonium groups, such as N,N,N,N',N', N'-hexabutyl-1,4-butanediammonium dihydroxide (HBBAH). Sch compounds enhance the stabilize of the aqueous CMP polishing compositions for storage, shipment and heat aging while maintaining a high removal rate.

In accordance with the present invention, suitable compounds containing two quaternary ammonium groups may comprise hexabutyl $C_1$-$C_8$ alkanediammonium dihydroxides or salts thereof, such as dihalides, or, preferably, N,N,N,N', N',N'-hexabutyl-1,4-butanediammonium dihydroxide (HBBAH).

In accordance with the present invention, suitable amounts of the compound containing two quaternary ammonium groups ranges from 1 to 2000 ppm or, preferably, from 5 to 500 ppm or, more preferably, 10 ppm to 200 ppm, based on the total silica solids, in the composition. The amount should be sufficient to ensure a stabilizing effect. More of the compound containing two quaternary ammonium groups is needed to stabilize concentrates and compositions having a higher silica concentration and/or a lower aminosilane concentration. More is also need to stabilize smaller average size particles owing to their increased surface area and potential for oligomerization or gelling.

In accordance with the present invention, suitable aminosilanes for use in making the aminosilane group containing silica particles of the present invention are tertiary amine group and secondary amine group containing aminosilanes. Suitable aminosilanes for use in the aqueous CMP polishing compositions of the present invention comprise an aminosilane containing one or more tertiary amine group, such as N,N-(diethylaminomethyl)triethoxysilane (DEAMS), or one or more secondary amine group, such as N-(2-aminoethyl)-3-aminopropyltrimethoxysilane (AEAPS) or N-aminoethylaminoethylaminopropyl trimethoxysilane (DEAPS aka DETAPS).

Suitable amounts of the aminosilane for use in the aqueous CMP polishing compositions in accordance with the present invention range from 0.0020 to 0.25 wt. % or, preferably, from 0.003 to 0.1 wt. % or, more preferably, from 0.003 to 0.02 wt. %, based on the total silica solids in the aqueous CMP polishing compositions.

The composition of the present invention is intended for dielectric polishing, such as interlayer dielectrics (ILD).

EXAMPLES

The following examples illustrate the various features of the present invention.

In the Examples that follow, unless otherwise indicated, conditions of temperature and pressure are ambient temperature and standard pressure.

The following materials were used in the Examples that follow: HBBAH=N,N,N,N',N',N'-hexabutyl-1,4-butanediammonium dihydroxide, 98 wt. % (Sachem, Austin, Tex.).

AEAPS=N-(2-aminoethyl)-3-aminopropyltrimethoxysilane, 98% (Gelest Inc., Morrisville, Pa.);

DEAMS=(N,N-diethylaminomethyl)triethoxysilane, 98%, (Gelest Inc.).

The various silica particles used in the Examples are listed in Table A, below.

TABLE A

Silica particles

| Aqueous Silica Slurry | Source | pH[5] | Particle size (CPS, nm) | Morphology | Raw Materials | Concentration (wt. % solids) |
|---|---|---|---|---|---|---|
| Slurry A | Klebosol ™,[1] 1598-B25 | 7.7 | 38 | Spherical | Na Silicate | 30 |
| Slurry B | Klebosol ™,[1] 1598-B12 | 7.7 | 25 | Spherical | Na Silicate | 30 |
| Slurry C | Klebosol ™,[1] 30H50 | 2.5 | 75 | Spherical | Na Silicate | 30 |
| Slurry G | HL-3 ™,[3] | 7.8 | 55 | Elongated, cationic[4] particle | TMOS | 20 |
| Slurry H | HL-2 ™,[3] | 7.8 | 45 | Elongated, cationic[4] particle | TMOS | 20 |
| Slurry J | PL-2 ™,[3] | 7.8 | 45 | Elongated | TMOS | 20 |
| Slurry K | PL-3 ™,[3] | 7.1 | 55 | Elongated | TMOS | 20 |
| Slurry L | BS-3 ™,[3,6] | 7.3 | 53 | Elongated, cationic[4] particle | TMOS | 20 |
| Slurry M | BS-2 ™,[3] | 7.1 | 45-48 | Elongated, cationic[4] particle | TMOS | 20 |
| Slurry N | PL-2L ™,[3] | 7.4 | 42 | spherical | TMOS | 20 |
| Slurry O | PL-3L ™,[3] | 7.4 | 52 | spherical | TMOS | 20 |

[1]Merck KgAA, Lamotte, France;
[3]Fuso Chemical, Osaka, JP;
[4]Charge determined at pH of 4.0 and cationic particles formed with TMOS and an amine containing alkaline catalyst, such as tetrannethylannnnoniunn hydroxide;
[5]pH as delivered from source.
[6]Fuso BS-3 particles were initially supplied as BS-2H particles but are now sold as BS-3 particles.

The following abbreviations were used in the Examples that follow:

POU: Point of use; RR: Removal rate;

The following test methods were used in the Examples that follow:

pH at POU: The pH at point of use (pH at POU) was that measured during removal rate testing after dilution of the indicated concentrate compositions with water to the indicated solids content.

Non-Uniformity: Standard deviation from average removal rate values taken from removal rates measured at multiple locations moving from the center to the edge of the pad.

Removal Rate: Removal rate testing from polishing on the indicated substrate was performed using the indicated polisher, such as a Strasbaugh 6EC 200 mm wafer polisher or "6EC RR" (Axus Technology Company, Chandler, Ariz.) or an Applied Materials Mirra™ 200 mm polishing machine or "Mirra RR" (Applied Materials, Santa Clara, Calif.), as indicated, at the indicated downforce and table and carrier revolution rates (rpm), and with the indicated CMP polishing pad and abrasive slurry at a given abrasive slurry flow rate 200 ml/min. A Diagrid™ AD3BG-150855 diamond pad conditioner (Kinik Company, Taiwan) was used to condition the polishing pad. The polishing pad was broken in with the pad conditioner using a down force of 6.35 kg (14.0 lb) for 20 minutes and was then further conditioned prior to polishing using a down force of 4.1 kg (9 lb) for 10 minutes. The polishing pad was further conditioned in situ during polishing at 10 sweeps/min from 4.32 cm to 23.37 cm from the center of the polishing pad with a down force of 4.1 kg (9 lb). The removal rates were determined by measuring the film thickness before and after polishing using a KLA-Tencor™ FX200 metrology tool (KLA Tencor, Milpitas, Calif.) using a 49 point spiral scan with a 3 mm edge exclusion.

Zeta Potential: Zeta potential of the indicated compositions was measured using a Malvern Zetasizer™ instrument (Malvern Instruments, Malvern, UK) as 15-30 wt % concentrates. The reported value was taken from a single measurement for each indicated composition.

Example 1: Polishing

In a removal rate test, a Mirra™ (Applied Materials) polishing device with a VP6000™ K7+R32 pad possessing circular grooves having a pitch of 1778 micron (70 mils) and an overlay of radial grooves (The Dow Chemical Company, Midland, Mich. (Dow)) was used to polish a TEOS substrate using the CMP polishing compositions defined in Table 1A, below, at a slurry flow rate of 200 ml/min, a 123 rpm platen speed, and a 117 rpm carrier speed. The polishing compositions were used at a total silica solids content of 1 to 2 wt. %. The Final pH was taken right after dilution at the POU

TABLE 1A

Formulations (all proportions are wt. %, based on total solids)

| Example | Slurry A Spherical, 38 nm | Slurry L Elongated, Cationic, 55 nm | Slurry G Elongated, Cationic, 55nm | DEAMS | HBBAH | Final pH | pH Titrant |
|---|---|---|---|---|---|---|---|
| 1* | | | 1 | | | 4 | $H_3PO_4$ |
| 2* | | 1 | | 0.0053 | 0.00042 | 4.5 | Succinic Acid |
| 3 | 0.5 | 1 | | 0.008 | 0.000625 | 4.5 | Succinic Acid |
| 4 | 1 | 1 | | 0.0107 | 0.00083 | 4.5 | Succinic Acid |
| 5* | | 1.5 | | 0.008 | 0.000625 | 4.5 | Succinic Acid |
| 6 | 0.5 | 1.5 | | 0.0107 | 0.00083 | 4.5 | Succinic Acid |
| 7* | | 2 | | 0.0107 | 0.00083 | 4.5 | Succinic Acid |
| 8* | | | 1.125 | 0.006 | 0.0005 | 4.5 | Succinic Acid |

*Denotes Comparative Example.

TABLE 1B

Removal Rate Performance

| Example | TEOS RR (13.79 kPa, A/min) | TEOS RR (20.68 kPa, A/min) | TEOS RR (27.58 kPa, A/min) | TEOS RR (34.47 kPa, A/min) | TEOS Non-Uniformity (34.47 kPa, %) |
|---|---|---|---|---|---|
| 1* | 2138 | 2407 | 2216 | 1533 | 13.0 |
| 2* | 2151 | 2736 | 2673 | 1345 | 23.9 |
| 3 | 2089 | 2839 | 3496 | 3976 | 3.8 |
| 4 | 2107 | 2916 | 3511 | 3945 | 4.4 |
| 5* | 2320 | 3245 | 3795 | 2552 | 12.5 |
| 6 | 2290 | 3157 | 3900 | 4571 | 4.6 |
| 7* | 2435 | 3413 | 4238 | 3766 | 4.3 |
| 8* | 2358 | 3070 | 3211 | 2261 | 11.7 |

*Denotes Comparative Example

TABLE 1C

Polishing Wear

| Example | 13.79 kPa Polishing T (° C.) | 20.68 kPa Polishing T (° C.) | 27.58 kPa Polishing T (° C.) | 34.47 kPa Polishing T (° C.) |
|---|---|---|---|---|
| 1* | 38.7 | 47.7 | 55.9 | 62.8 |
| 2* | 37.3 | 45.3 | 54.6 | 63.5 |
| 3 | 35.3 | 40.5 | 46.7 | 53.7 |
| 4 | 34.5 | 38.7 | 43.2 | 48.3 |
| 5* | 36.7 | 43.7 | 52.3 | 61.8 |
| 6 | 35.1 | 40.9 | 46.5 | 52.4 |
| 7* | 36.5 | 42.6 | 50.0 | 60.2 |
| 8* | 37.5 | 45.6 | 54.1 | 62.1 |

As shown in Tables 1B and 10, above, the inventive compositions exhibit all of improved removal rate at higher polishing downforce, more even polishing (uniformity) and reduced temperature and thus, reduced pad wear, during polishing, less pronounced center-slow profiles and reduced RR vs. downforce curve bending behavior among the groups of slurries. In Comparative Examples 1, 2, 5, 7 and 8, without a mixture of both a DEAMS containing spherical silica particles in Slurry A and the elongated, bent or nodular silica particles in Slurry G or Slurry K, none of the aqueous CMP polishing compositions formulations exhibited a linear P-curve in which removal rate increased or remained consistent with increased downforce. Furthermore, at 34.47 kPa, the aqueous CMP polishing compositions of Comparative Examples 1, 2, 5, 7 and 8 with solely elongated, bent or nodular silica particles slurries showed a >10% profile non-uniformity. Meanwhile, all inventive Examples 3, 4 and 6 containing a mixture of spherical colloidal silica and elongated, bent or nodular silica particles that differ from each other in weight average particle sizes (CPS) less than 20 nm, all exhibited a 34.47 kPa non-uniformity below 5% and a P-curve more linear with higher removal rates at higher downforces. In addition, the polishing temperatures of the inventive aqueous CMP polishing compositions are significantly lower than those from such compositions of only elongated, bent or nodular silica particles, implying less pad texture wearing and potentially longer pad life.

Example 2: Polishing of Lamer Pads

In a removal rate test, a Reflexion™ (Applied Materials) polishing device with an IC1000™ K7+R32 pad (Dow) was used to polish a TEOS substrate using the CMP polishing compositions defined in Table 2A, below at a slurry flow rate of 300 ml/min, a 93 rpm platen speed, and an 87 rpm carrier speed. The polishing compositions were used at a total silica solids content of 1-2 wt. %. The Final pH was taken right after dilution at the POU.

TABLE 2A

Formulations (all proportions are wt. %, based on total solids)

| Example | Slurry L Elongated 53 nm | Slurry G Elongated Cationic, 55nm | Slurry A Spherical 38 nm | Slurry C Spherical 75 nm | DEAMS | HBBAH | Final pH | pH Titrant |
|---|---|---|---|---|---|---|---|---|
| 11* |  | 1.125 |  |  | 0.006 | 0.0005 | 4.5 | Succinic Acid |
| 12 | 1 |  | 1 |  | 0.0107 | 0.00083 | 4.5 | Succinic Acid |
| 13* |  |  | 5 | 1 | 0.05 |  | 3 | Nitric Acid |

*Denotes Comparative Example

TABLE 2B

Removal Rate Performance

| Example | TEOS RR (6.895 kPa, A/min) | TEOS RR (13.79 kPa, A/min) | TEOS RR (20.68 kPa, A/min) | TEOS RR (27.58 kPa, A/min) | TEOS RR (34.47 kPa, A/min) |
|---|---|---|---|---|---|
| 11* | 1305 | 2414 | 3395 | 4115 | 4182 |
| 12 | 1245 | 2217 | 2991 | 3748 | 4316 |
| 13* | 1164 | 2114 | 2909 | 3401 | 3717 |

*Denotes Comparative Example

TABLE 2C

Polishing Wear

| Example | 6.895 kPa Polishing T (° C.) | 13.79 kPa Polishing T (° C.) | 20.68 kPa Polishing T (° C.) | 27.58 kPa Polishing T (° C.) | 34.47 kPa Polishing T (° C.) |
|---|---|---|---|---|---|
| 11* | 28.5 | 37.2 | 47.2 | 56.8 | 65.6 |
| 12 | 27.2 | 34.6 | 41.7 | 48.7 | 56.1 |
| 13* | 25.1 | 33.9 | 41.9 | 48.5 | 55.0 |

*Denotes Comparative Example

As shown in Tables 2B and 2C, above, the aqueous CMP polishing compositions of Example 12 (2%) at a 1:1 solids weight ratio of spherical colloidal silica to elongated, bent or nodular silica gave a linear P-curve and a flat 5 psi RR profile when compared to an acidic slurry of spherical colloidal silica having a much higher particle solids content in Comparative Example 13 (6%). The center slow issue of slurry 18 (1.125%) at 5 psi remained. It is noteworthy that the polishing temp of the inventive aqueous CMP polishing compositions of Example 12 remained low when compared to a low solids aqueous CMP polishing composition in Comparative Example 11.

Example 3: Polishing Compositions with Various Aminosilanes

In a removal rate test, a Mirra™ (Applied Materials) polishing device with a VP6000™ K7+R32 pad (Dow) was used to polish a TEOS substrate using the CMP polishing compositions defined in Table 3A, below at a slurry flow rate of 200 ml/min, a 93 rpm platen speed, and an 87 rpm carrier speed. The polishing compositions were used at a total silica solids content of 2 wt. %. The Final pH was taken just after dilution at the POU.

TABLE 3A

Formulations (all proportions are wt. %, based on total solids)

| Example | Slurry L Elongated 53 nm | Slurry A Spherical 38 nm | DEAMS | AEAPS | HBBAH | Final pH | pH Titrant |
|---|---|---|---|---|---|---|---|
| 14 | 1 | 1 | 0.011 |  | 0.0008 | 4.5 | Succinic Acid |
| 15 | 1 | 1 |  | 0.004 | 0.0008 | 4.5 | Succinic Acid |
| 16 | 1 | 1 |  | 0.005 | 0.0008 | 4.5 | Succinic Acid |

TABLE 3B

Removal Rate Performance

| Example | TEOS RR (20.68 kPa, A/min) | TEOS RR (34.47 kPa, A/min) | TEOS Non-Uniformity (20.68 kPa, %) | TEOS Non-Uniformity (34.47 kPa, %) |
|---|---|---|---|---|
| 14 | 2408 | 3364 | 6.5 | 4.7 |
| 15 | 2235 | 2962 | 7.3 | 3.9 |
| 16 | 2208 | 2969 | 7.2 | 4.9 |

With the use of a secondary amine group containing aminosilane (AEAPS), the inventive compositions of Examples 15 and 16 exhibited similar removal rate and uniformity behavior to that of the composition in Example 14, containing a tertiary amine group containing aminosilane (DEAMS). All of the examples had a 1:1 weight ratio of The P-curves (removal rate curves) are reasonably linear and 5 psi removal profiles of compositions containing AEAPS are as consistent at a higher downforce (34.47 kPa) as compositions containing DEAMS even if their removal rates are slightly lower.

Example 4: Polishing Performance

In a removal rate test, a Mirra™ (Applied Materials) polishing device with a VP6000™ K7+R32 pad (Dow) was used to polish a TEOS substrate using the CMP polishing compositions defined in Table 4A, below at a slurry flow rate of 200 ml/min, a 123 rpm platen speed, and a 117 rpm carrier speed. The polishing compositions were used at a total silica solids content of 1-2 wt. %. The Final pH was taken right after dilution at the POU.

TABLE 4A

Formulations (all proportions are wt. %, based on total solids)
In all of Examples 17, 18, 19, 20 and 21, below, the formulations contain HBBAH
in the amount of 0.001 wt. % or 10 ppm and DEAMS in the amount of 0.011 wt. %.

| Example | Slurry A spherical 38 nm | Slurry J elongated 45 nm | Slurry N spherical 42 nm | SlurryO spherical 52 nm | Slurry L Elongated, cationic 45-48 nm | Final pH | pH Titrant |
|---|---|---|---|---|---|---|---|
| 17 | 1 | | | | 1 | 4.5 | Succinic Acid |
| 18* | | 1 | | | 1 | 4.5 | Succinic Acid |
| 19 | | | 1 | | 1 | 4.5 | Succinic Acid |
| 20 | | | | 1 | 1 | 4.5 | Succinic Acid |
| 21* | | | | | 2 | 4.5 | Succinic Acid |

*Denotes Comparative Example

TABLE 4B

Removal Rate Performance

| Example | TEOS RR (13.79 kPa, A/min) | TEOS RR (20.68 kPa, A/min) | TEOS RR (27.58 kPa, A/min) | TEOS RR (34.47 kPa, A/min) | TEOS Non-Uniformity (34.47 kPa, %) |
|---|---|---|---|---|---|
| 17 | 2062 | 2817 | 3395 | 3817 | 5.0 |
| 18* | 2053 | 2878 | 2890 | 1260 | 19.9 |
| 19 | 1966 | 2669 | 3374 | 3799 | 5.6 |
| 20 | 1540 | 1961 | 2401 | 2866 | 4.2 |
| 21* | 2422 | 3280 | 3335 | 1753 | 19.0 |

*Denotes Comparative Example

TABLE 4C

Polishing Wear

| Example | 13.79 kPa Polishing T (° C.) | 20.68 kPa Polishing T (° C.) | 27.58 kPa Polishing T (° C.) | 34.47 kPa Polishing T (° C.) |
|---|---|---|---|---|
| 17 | 35.1 | 39.9 | 45.0 | 49.7 |
| 18* | 37.8 | 44.4 | 55.1 | 66.0 |
| 19 | 36.2 | 41.2 | 47.9 | 55.1 |
| 20 | 33.9 | 38.2 | 44.3 | 53.5 |
| 21* | 37.9 | 45.7 | 55.3 | 65.2 |

*Denotes Comparative Example

As shown in Tables 4B and 4C, above, the inventive mixture of spherical colloidal silica and elongated, bent or nodular silica particles that differ from each other in weight average particle sizes (CPS) less than 20 nm gives superior removal rate and uniformity in polishing as well as enabling polishing with reduced pad wear. As shown in Comparative Examples 18 and 21, respectively, simply blending two elongated silica particles or just one type of cocoon particles does not enable effective polishing at a high downforce. When spherical silica particles are introduced in the formulation of elongated, bent or nodular silica particles, the non-uniformity of polished wafers improved significantly. Comparing inventive Examples 19-20 to Example 17, the spherical silica particles made from water glass give superior polishing wear results and more consistent polishing results, such as at 27.58 kPa to spherical silica particles made by suspension polymerization from tetraalkoxysilicates, like TMOS and TEOS.

Example 5: Polishing with Formulation Variants

In a removal rate test, a Mirra™ (Applied Materials) polishing device with a VP6000™ K7+R32pad (Dow) was used to polish a TEOS substrate using the CMP polishing compositions defined in Table 5A, below at a slurry flow rate of 200 ml/min, a 123 rpm platen speed, and a 117 rpm carrier speed. The polishing compositions were used at a total silica solids content of 1-2 wt. % and are shown in Table 5A, below. The Final pH was taken right after dilution at the POU.

TABLE 5A

Formulations (all proportions are wt. %, based on total solids)

| Example | Slurry M | Slurry L | DEAMS | Slurry A | Slurry L | DEAMS | Final pH | pH Titrant |
|---|---|---|---|---|---|---|---|---|
| 22* | | | | 2 | | 0.0107 | 4.5 | Succinic Acid |
| 23* | 2 | | 0.0107 | | | | 4.5 | Succinic Acid |
| 24 | 1 | | 0.00535 | 1 | | 0.00535 | 4.5 | Succinic Acid |
| 25 | | 1 | | 1 | | 0.00535 | 4.5 | Succinic Acid |
| 26* | | 1 | | | 1 | 0.00535 | 4.5 | Succinic Acid |

TABLE 5A-continued

Formulations (all proportions are wt. %, based on total solids)

| Example | Slurry M | Slurry L | DEAMS | Slurry A | Slurry L | DEAMS | Final pH | pH Titrant |
|---|---|---|---|---|---|---|---|---|
| 27* | | 1 | 0.00535 | | | | | |
| 28* | | 1.5 | 0.008 | | | | | |

*Denotes Comparative Example

TABLE 5B

Removal Rate Performance

| Example | TEOS RR (20.68 kPa, A/min) | TEOS RR (27.58 kPa, A/min) | TEOS RR (34.47 kPa, A/min) | TEOS Non-Uniformity (34.47 kPa, %) |
|---|---|---|---|---|
| 22* | 1974 | 2356 | 2623 | 3.8 |
| 23* | 3372 | 4265 | 3200 | 5.2 |
| 24 | 2839 | 3420 | 3897 | 5.4 |
| 25 | 2857 | 3401 | 3871 | 4.2 |
| 26* | 3518 | 4198 | 3274 | 9.6 |
| 27* | 2948 | 3120 | 1734 | 19.8 |
| 28* | 3302 | 4093 | 3826 | 2.9 |

*Denotes Comparative Example

TABLE 5C

Polishing Wear

| Example | 20.68 kPa Polishing T (° C.) | 27.58 kPa Polishing T (° C.) | 34.47 kPa Polishing T (° C.) |
|---|---|---|---|
| 22* | 35.4 | 38.6 | 41.7 |
| 23* | 43.8 | 49.6 | 61.8 |
| 24 | 40.7 | 43.5 | 47.9 |
| 25 | 41.9 | 46.0 | 52.2 |
| 26* | 45.6 | 53.1 | 63.2 |
| 27* | 42.2 | 49.5 | 58.9 |
| 28* | 44.7 | 53.3 | 62.4 |

*Denotes Comparative Example

As shown in Tables 5B and 5C, above, the compositions in inventive Examples 24 and 25 having a mixture of spherical colloidal silica and elongated, bent or nodular silica particles that differ from each other in weight average particle sizes (CPS) less than 20 nm, dramatically outperform Comparative Example 22-23 and 26 compositions wherein there is no mixture of silica particles (C. Ex 22-23) or the mixture comprises all elongated silica particles (C. Ex 26-27). Comparative Example 28 gives good removal rate performance but causes heat, and the potential for wear, to build up during polishing. As shown in Table 5B, above, the polishing performance of the compositions of inventive Examples 24 and 25 is enhanced at high polishing downforces.

We claim:

1. An aqueous chemical mechanical planarization (CMP) polishing composition comprising a mixture of spherical colloidal silica and elongated, bent or nodular silica particles that differ from each other in weight average particle size (CPS) less than 20 nm, the composition having a pH ranging from 2.5 to 5.3, wherein at least one of the spherical colloidal silica particles and the elongated, bent or nodular silica particles contains one or more cationic nitrogen atoms, and, further wherein, the amount of the elongated, bent or nodular silica particles ranges from 30 to 99 wt. %, based on the total weight of silica solids in the aqueous CMP polishing composition.

2. The aqueous CMP polishing composition as claimed in claim 1, wherein the amount of the elongated, bent or nodular silica particles ranges from 40 to 90 wt. %, based on the total weight of silica solids in the aqueous CMP polishing composition.

3. The aqueous CMP polishing composition as claimed in claim 1, wherein the one or more cationic nitrogen atoms comes from a protonated amine or quaternary ammonium that is contained within the elongated, bent or nodular silica particles and as well from an aminosilane that contains one or more cationic nitrogen atom at the pH of the aqueous CMP polishing composition, whereby at least one of the spherical colloidal silica particles or the elongated, bent or nodular silica particles are aminosilane group containing silica particles.

4. The aqueous CMP polishing composition as claimed in claim 3, wherein the aminosilane is chosen from an aminosilane containing one or more tertiary amine group, or one or more secondary amine group.

5. The aqueous CMP polishing composition as claimed in claim 4, wherein the one or more cationic nitrogen atoms in the at least one elongated, bent or nodular silica particles is incorporated by hydrolytic condensation of silanols with alkylammonium hydroxides or alkylamines in aqueous suspension.

6. The aqueous CMP polishing composition as claimed in claim 1, further comprising a compound containing two quaternary ammonium groups.

7. The aqueous CMP polishing composition as claimed in claim 6, wherein the amount of the compound containing two quaternary ammonium groups ranges from 1 to 2000 ppm, based on the total silica solids in the aqueous CMP polishing composition.

8. The aqueous CMP polishing composition as claimed in claim 1, wherein the weight average particle sizes (CPS) of the silica particles ranges from 10 nm to 200 nm.

9. The aqueous CMP polishing composition as claimed in claim 1, further comprising a buffer, which is a carboxylate of a (di)carboxylic acid pKa of 3 to 7 in the amount of from 0 to 50 millimoles per kg (mm/kg) of the total (wet) composition.

10. The aqueous CMP polishing composition as claimed in claim 1, wherein the total amount of silica particles ranges from 1 to 30 wt. %, based on the total weight of the composition.

11. The aqueous CMP polishing composition as claimed in claim 1, wherein at least one of the elongated, bent or nodular silica particles contains within the particle one or more cationic nitrogen atoms that comes from a protonated amine or quaternary ammonium.

* * * * *